(12) United States Patent
Paul et al.

(10) Patent No.: US 9,973,182 B2
(45) Date of Patent: May 15, 2018

(54) RE-TIMING BASED CLOCK GENERATION AND RESIDUAL SIDEBAND (RSB) ENHANCEMENT CIRCUIT

(71) Applicant: QUALCOMM Incorporated, San Diego, CA (US)

(72) Inventors: Animesh Paul, Bangalore (IN); Jingcheng Zhuang, San Diego, CA (US); Xinhua Chen, San Diego, CA (US); Ravi Sridhara, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 77 days.

(21) Appl. No.: 15/265,217

(22) Filed: Sep. 14, 2016

(65) Prior Publication Data

US 2018/0076805 A1 Mar. 15, 2018

(51) Int. Cl.
| | | |
|---|---|---|
| *H03K 21/00* | (2006.01) | |
| *H03K 23/00* | (2006.01) | |
| *H03K 25/00* | (2006.01) | |
| *H03K 5/156* | (2006.01) | |
| *H03K 21/02* | (2006.01) | |

(52) U.S. Cl.
CPC ........... *H03K 5/1565* (2013.01); *H03K 21/02* (2013.01)

(58) Field of Classification Search
USPC .......................................... 327/114, 115, 117
See application file for complete search history.

(56) References Cited

U.S. PATENT DOCUMENTS

| | | | |
|---|---|---|---|
| 4,125,811 A | 11/1978 | Caron | |
| 4,274,150 A * | 6/1981 | Ikenishi | ................... G04C 3/14 368/185 |
| 6,333,659 B1 | 12/2001 | Saeki | |
| 6,377,100 B1 | 4/2002 | Fujieda | |
| 7,336,114 B2 | 2/2008 | Razavi et al. | |

(Continued)

FOREIGN PATENT DOCUMENTS

| | | |
|---|---|---|
| JP | S5643755 A | 4/1981 |
| JP | 2000013197 A | 1/2000 |

OTHER PUBLICATIONS

Krishnapura N., et al., "A 5.3-GHz Programmable Divider for HiPerLAN in 0.25 μm CMOS", IEEE Journal of Solid-State Circuits, vol. 35, No. 7, Jul. 2000, pp. 1019-1024.

(Continued)

*Primary Examiner* — Adam Houston
(74) *Attorney, Agent, or Firm* — Patterson & Sheridan, L.L.P

(57) ABSTRACT

Certain aspects of the present disclosure generally relate to methods and apparatus for generating clock signals. For example, certain aspects of the present disclosure provide a clock generation circuit. The clock generation circuit may include a first transistor connected in cascode with a second transistor, wherein an input clock node of the circuit is coupled to gates of the first and second transistors. The clock generation circuit may also include a frequency divider circuit having an input coupled to the input clock node, wherein an output of the frequency divider circuit is coupled to a source of the second transistor, and wherein an output node of the circuit is coupled to drains of the first and second transistors.

25 Claims, 14 Drawing Sheets

(56) References Cited

U.S. PATENT DOCUMENTS

| | | | |
|---|---|---|---|
| 7,626,437 B2 | 12/2009 | Naujokat | |
| 8,928,369 B1* | 1/2015 | Jaeger | H03K 5/15006 327/115 |
| 2001/0028267 A1 | 10/2001 | Kobayashi et al. | |
| 2002/0030456 A1* | 3/2002 | Kim | H05B 41/2828 315/307 |
| 2007/0075687 A1* | 4/2007 | Ishii | H02M 3/1582 323/225 |
| 2009/0121763 A1* | 5/2009 | Bossu | H03K 5/1565 327/175 |
| 2010/0039153 A1* | 2/2010 | Qiao | H03K 23/42 327/254 |
| 2012/0169382 A1* | 7/2012 | Hung | H03K 21/10 327/115 |
| 2015/0091658 A1* | 4/2015 | Shima | H03L 7/24 331/8 |
| 2015/0349781 A1* | 12/2015 | Torres | H03B 5/12 375/219 |
| 2016/0028347 A1* | 1/2016 | Okamoto | H03B 5/24 331/108 R |
| 2016/0037212 A1* | 2/2016 | Dong | H04N 5/38 348/441 |
| 2016/0072507 A1* | 3/2016 | Jia | H03K 21/02 327/118 |
| 2016/0315623 A1* | 10/2016 | Beghein | H03K 23/50 |
| 2017/0149438 A1* | 5/2017 | Xue | H03L 7/099 |

OTHER PUBLICATIONS

Partial International Search Report-PCT/US2017/051336—ISA/EPO—dated Jan. 5, 2018.

\* cited by examiner

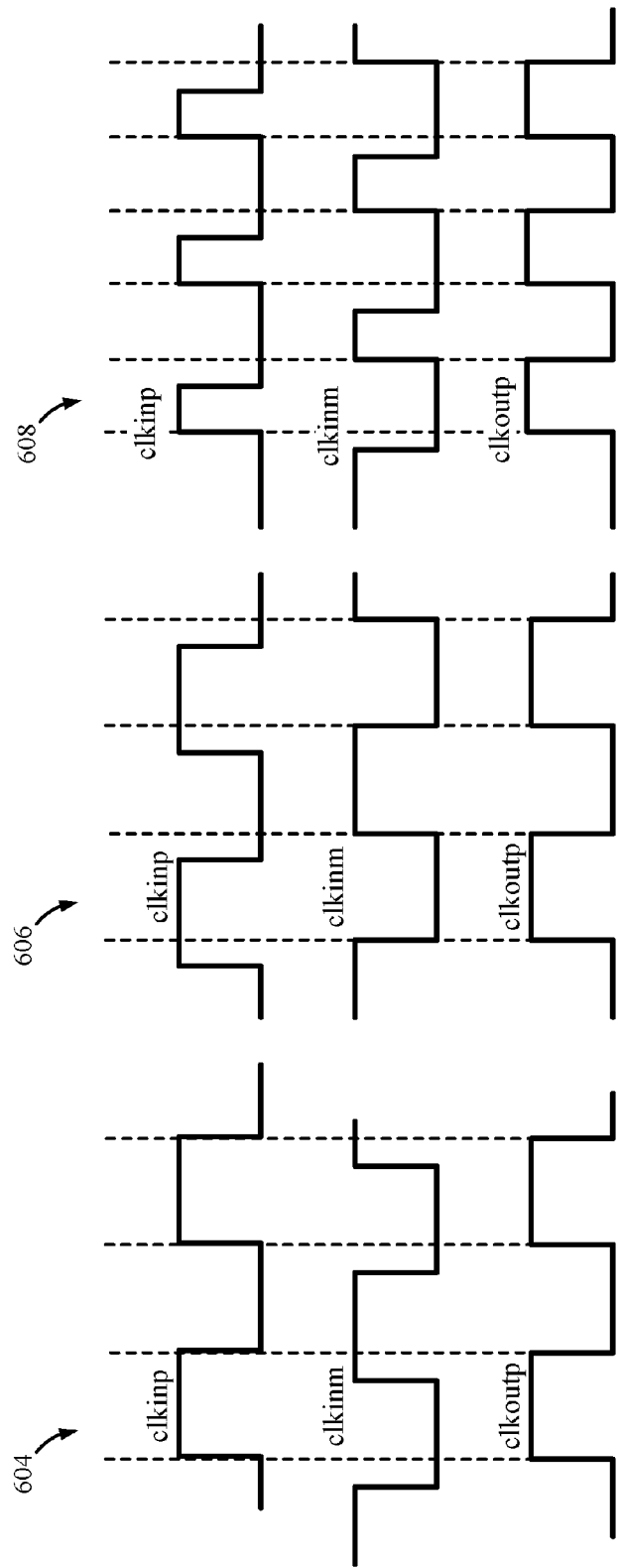

RE-TIMING BASED CLOCK GENERATION AND RESIDUAL SIDEBAND (RSB) ENHANCEMENT CIRCUIT

TECHNICAL FIELD

Certain aspects of the present disclosure generally relate to electronic circuits and, more particularly, to a circuit for generating a clock signal.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3rd Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

MSs and BSs may generate one or more clock signals to be used in receiving and/or transmitting signals. For example, clock signals (e.g., local oscillator signals) may be used to upconvert signals for transmission and/or downconvert received signals. These operations may be performed via one or more mixers and frequency divider circuits.

SUMMARY

Certain aspects of the present disclosure generally relate to generating clock signals.

Certain aspects of the present disclosure provide a clock generation circuit. The clock generation circuit generally includes a first transistor connected in cascode with a second transistor, wherein an input clock node of the circuit is coupled to gates of the first and second transistors, and a frequency divider circuit having an input coupled to the input clock node, wherein an output of the frequency divider circuit is coupled to a source of the second transistor, and wherein an output node of the circuit is coupled to drains of the first and second transistors.

Certain aspects of the present disclosure provide a circuit for generating a differential clock signal. The circuit generally includes a first p-channel metal-oxide semiconductor (PMOS) transistor connected in cascode with a first n-channel metal-oxide semiconductor (NMOS) transistor, wherein a source of the first PMOS transistor is coupled to a voltage rail, and a second PMOS transistor connected in cascode with a second NMOS transistor, wherein a source of the second NMOS transistor is coupled to a reference potential, sources of the first NMOS transistor and the second PMOS transistor are coupled to a first output of a differential output node of the circuit, a gate of the first PMOS transistor and a gate of the second NMOS transistor are coupled to a first input clock node of a differential input of the circuit, and a gate of the first NMOS transistor and a gate of the second PMOS transistor are coupled to a second input clock node of the differential input.

Certain aspects of the present disclosure provide a method for generating an output clock signal. The method generally includes receiving an input clock signal at gates of a first transistor and a second transistor, wherein the first and second transistors are connected in cascode, dividing a frequency of the input clock signal to generate a frequency-divided clock signal, providing the frequency-divided clock signal to a source of the first transistor, and generating the output clock signal at drains of the first and second transistors based on the input clock signal and the frequency-divided clock signal.

Certain aspects of the present disclosure provide a method for generating a differential clock signal with reduced phase delay compared to a differential input clock signal. The method generally includes receiving a first input clock signal of the differential input clock signal at a gate of a first PMOS transistor connected in cascode with a first NMOS transistor and at a gate of a second NMOS transistor connected in cascode with a second PMOS transistor, receiving a second input clock signal of the differential input clock signal at a gate of the first NMOS transistor and a gate of the second PMOS transistor, and generating a first output clock signal of the differential output clock signal at sources of the first NMOS transistor and the second PMOS transistor.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIGS. 6B-6D are graphs of example input and output signals of the example RSB enhancement circuit of FIG. 6A, in accordance with certain aspects of the present disclosure.

DETAILED DESCRIPTION

Figure 1:
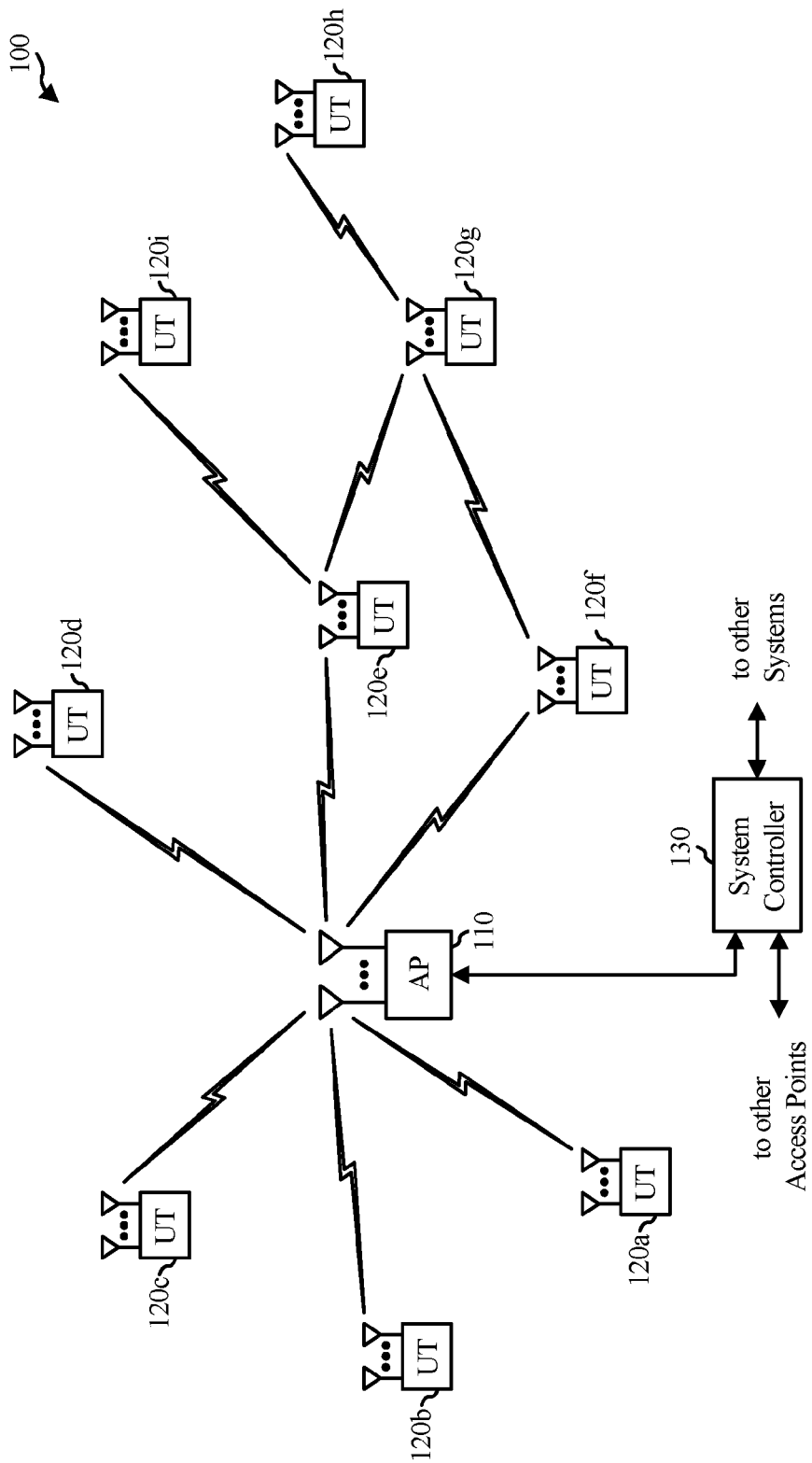
FIG. 1 is a diagram of an example wireless communications network, in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

In certain aspects of the present disclosure, the access point 110 and/or user terminal 120 may include one or more mixers configured to receive local oscillator (LO) signals. In certain aspects, the LO signals may be generated using clock generation and residual sideband (RSB) enhancement circuitry, as described in more detail herein.

Figure 2:
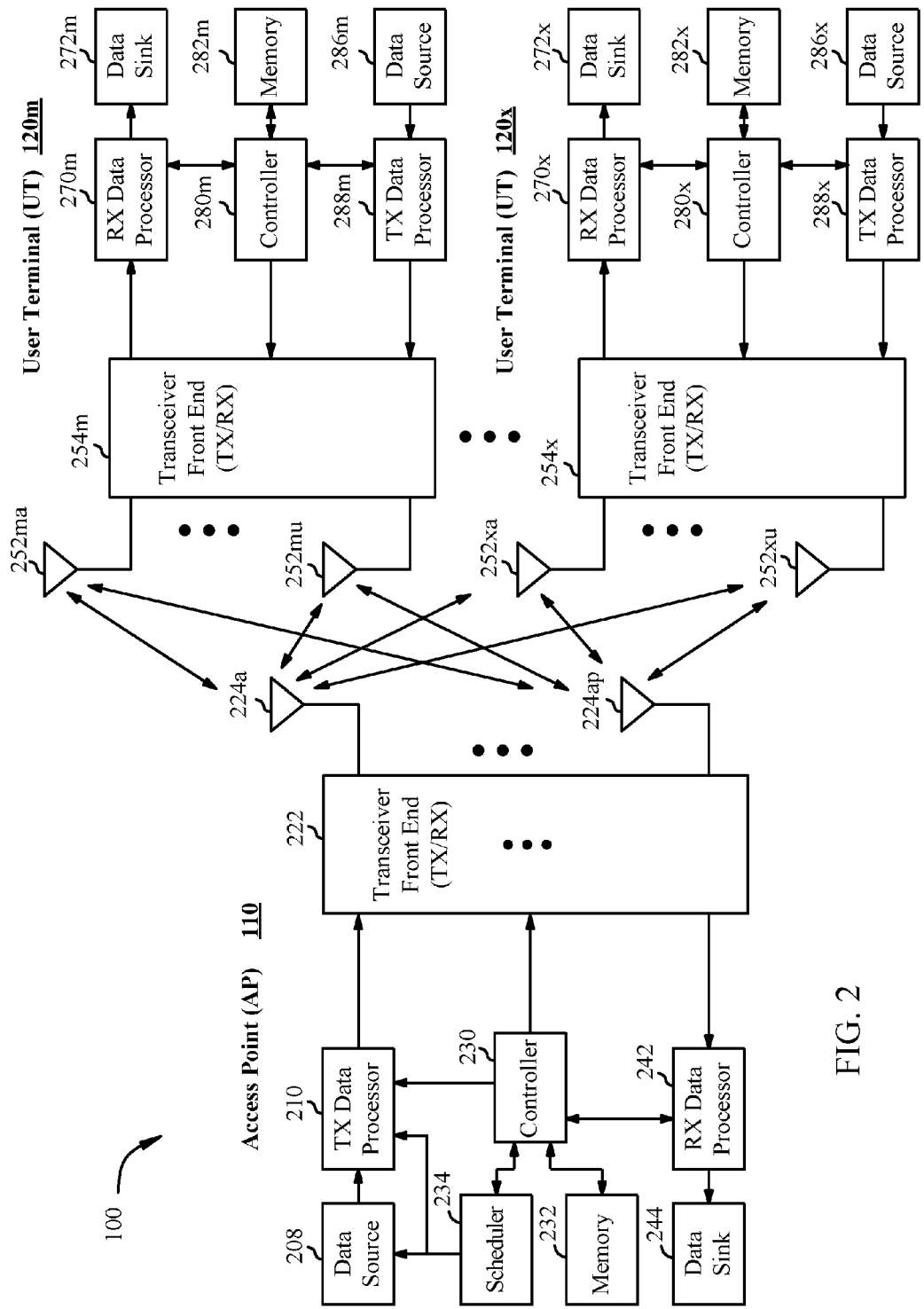
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or transceiver front end 254 of user terminal 120 may include one or more mixers configured to receive LO signals. In certain aspects, the LO signals may be generated using clock generation and RSB enhancement circuitry, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
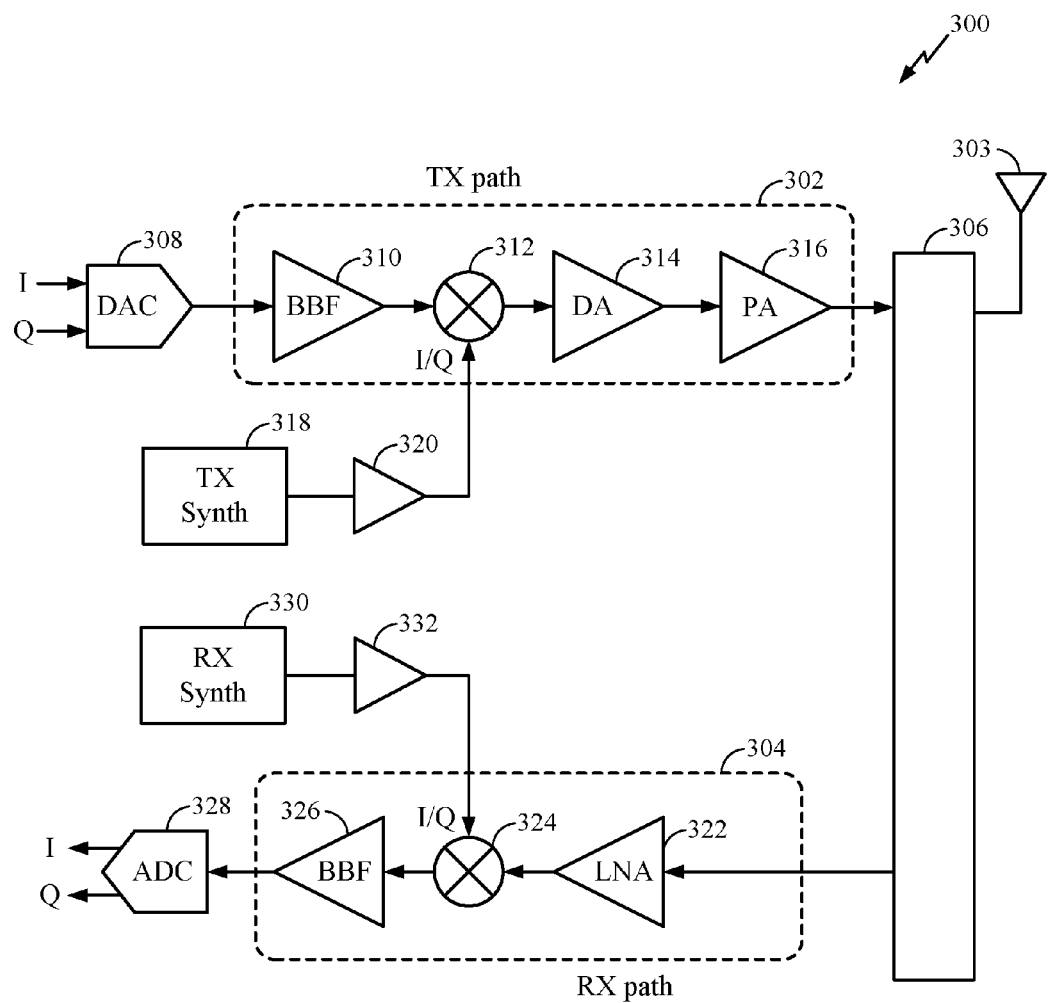
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit LO signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive LO signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing. In certain aspects, the LO signals received by mixers 312 and 324 may be generated using clock generation and RSB enhancement circuitry, as described in more detail herein.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Clock Generation Circuit

Mixers for receivers (RX) and transmitters (TX), such as the mixer 324 and mixer 312, respectively, may be implemented using a clock signal having a 25% duty cycle. For example, the clock signal may be used as the local oscillator (LO) signal for the mixers 312 and 324. In some cases, four non-overlapping clock signals having a 25% duty cycle may be generated, each corresponding to one of a positive in-phase (IP) signal, a negative in-phase signal (IM), and positive quadrature signal (QP), and a negative quadrature signal (QM).

In some cases, the clock signals may be generated by performing a NAND logic operation on a frequency-divided signal generated based on input differential in-phase and quadrature signals. However, the frequency divider used to generate the frequency-divided signal may contribute to the LO phase noise. Moreover, efforts to improve phase noise performance may result in increased power consumption. In some cases, the NAND gate used to apply the NAND logic operation may also contribute to the phase noise of the clock signal.

Certain aspects of the present disclosure are directed to a clock generation circuit that operates on a re-timing based principle and eliminates (or at least reduces) the phase noise contribution from other stages (e.g., the frequency divider circuitry).

Figure 4:
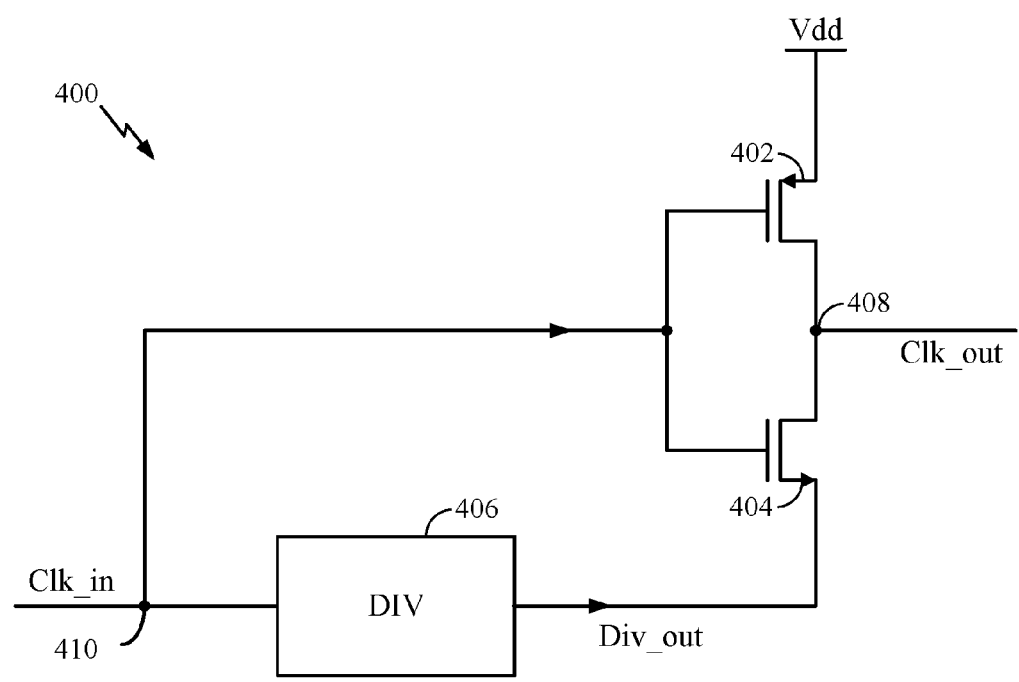
FIG. 4 illustrates an example circuit for generating a clock signal, in accordance with certain aspects of the present application.

FIG. 4 illustrates an example clock generation circuit 400, in accordance with certain aspects of the present disclosure. The clock generation circuit 400 may include cascode-connected transistors 402 and 404, which may be implemented using a p-channel metal-oxide semiconductor (PMOS) transistor 402 and an n-channel metal-oxide semiconductor (NMOS) transistor 404. As illustrated, the gates of transistors 402 and 404 may be coupled to the input clock node 410. As illustrated, the input clock node 410 provides an input clock signal (CLK_in), which may have a 50% duty cycle, for example. Based on the input clock signal, an output clock signal (CLK_out) may be generated at the drains of the transistors 402 and 404 (at output node 408), and CLK_out may have a 25% duty cycle. In certain aspects, the source of transistor 402 may be coupled to a voltage rail Vdd, and the source of transistor 404 may be coupled to an output of a frequency divider (DIV) 406. In certain aspects, the frequency divider 406 may be configured to divide the frequency of the input clock signal by two.

Figure 5:
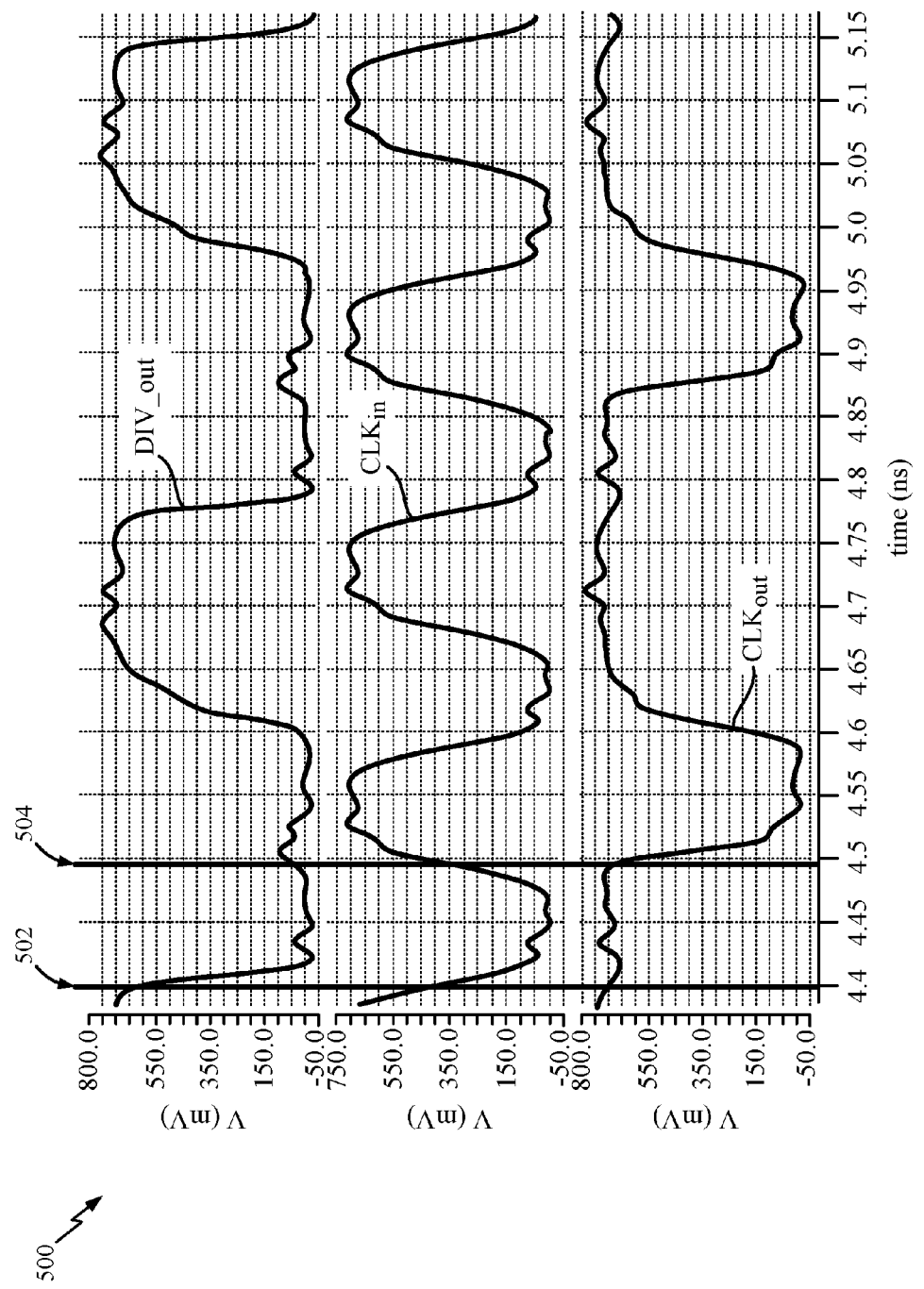
FIG. 5 is a graph illustrating example signals generated by the circuit of FIG. 4, in accordance with certain aspects of the present disclosure.

FIG. 5 is a graph 500 illustrating an example CLK_in signal, an example DIV_out signal, and an example CLK_out signal of the clock generation circuit 400, in accordance with certain aspects of the present disclosure. When the DIV_out signal is low and CLK_in signal is high, then transistor 404 turns on (closes), and transistor 402 turns off (opens). Thus, the output node 408 at the drains of transistors 402 and 404 discharges, reducing the voltage of the CLK_out signal. Thus, the CLK_out signal is re-timed with the CLK_in signal rise time. When CLK_in goes low, transistor 404 turns off, transistor 402 turns on, and the output node 408 goes high irrespective of the voltage of the DIV_out signal. However, when the DIV_OUT signal is high, even if CLK_in goes high, transistor 404 is unable to discharge the output node 408 because the source of transistor 404 is high (e.g., at DIV_OUT signal voltage level). Therefore, the clock generation circuit 400 generates the re-timed CLK_out signal having a 25% duty cycle.

The clock generation circuit 400 for generating the CLK_out signal eliminates (or at least reduces) phase noise contribution by the frequency divider 406, allowing for a lower power design for the frequency divider. For example, at time 502, when the DIV_out signal is transitioning from logic high to logic low, the CLK_in signal also transitions from logic high to logic low, and the CLK_out signal remains high. Therefore, the transition of DIV_out from logic high to logic low does not impact the phase noise of the CLK_out signal. Moreover, at time 504, when the CLK_in signal transitions from logic low to logic high, the DIV_out signal is already low, and thus, the phase noise of the CLK_out signal is again not impacted by the DIV_out signal. Thus, aspects of the present disclosure improve phase noise and lower power consumption. In addition, the clock generation circuit 400 also helps to improve the residual sideband (RSB). For example, as the clock generation circuit 400 is based on re-timing the DIV_out signal, any mismatch coming from the frequency divider 406 has little to no impact on the CLK_out signal, improving the RSB statistical variation.

Residual Sideband (RSB) Enhancement Circuit

Certain aspects of the present disclosure are generally directed to a residual sideband (RSB) enhancement circuit for correcting phase error between positive and negative signals of a differential clock. For example, the differential clock may be an LO signal (or used to generate the LO signal) to be provided to a mixer (e.g., mixer 312 or mixer 324). Any phase shift between the positive and negative clock signals could cause phase error between in-phase (I) and quadrature (Q) clock signals, which may degrade the RSB at the mixer output. Aspects of the present disclosure correct for any phase error between differential clocks positive and negative signals to reduce the IQ phase error at the output of the mixer and improve RSB.

Figure 6A:
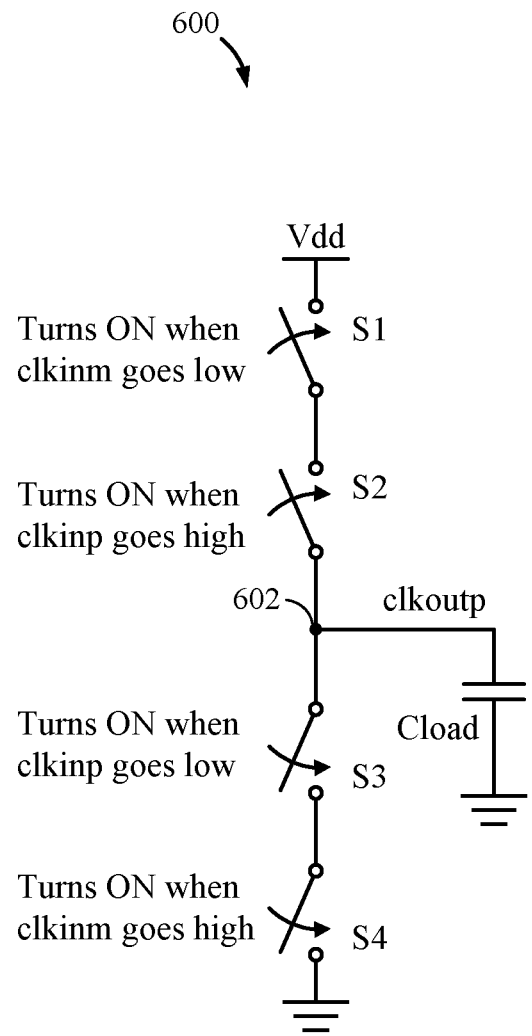
FIG. 6A illustrates an example residual sideband (RSB) enhancement circuit, in accordance with certain aspects of the present disclosure.

FIG. 6A illustrates an example RSB enhancement circuit 600, in accordance with certain aspects of the present disclosure. As illustrated, the RSB enhancement circuit 600 includes two switches S1 and S2 coupled in series between a voltage rail Vdd and an output node 602 and two switches S3 and S4 between the output node 602 and a reference potential. The signal at the output node 602 (Clkoutp) may transition from logic low to logic high when S1 and S2 are closed, and Clkoutp may transition from logic high to logic low when S3 and S4 are closed.

Switches S1, S2, S3, and S4 may be controlled based on clkinp and clkinm signals, which are two complementary signals of a differential input clock signal pair. When generating a positive clock signal (clkoutp) of a differential clock signal, switch S1 may be configured to close when clkinm goes low, switch S2 may be configured to close when clkinp goes high, switch S3 may be configured to close when clkinp goes low, and switch S4 may be configured to close when clkinm goes high. In this manner, the clkoutp signal may be sensitive to whichever rising/falling edge of clkinp or clkinm occurs later in time.

FIG. 6B is a graph 604 of example clkinp, clkinm, and clkoutp signals of the RSB enhancement circuit 600, in accordance with certain aspects of the present disclosure. In this example, the falling and rising edges of the clkinm signal occur before the rising and falling edges of the clkinp signal, respectively. However, the rising and falling edges of the clkoutp signal coincide with the rising and falling edges of the clkinp signal, respectively.

FIG. 6C is another graph 606 of example clkinp, clkinm, and clkoutp signals of the RSB enhancement circuit 600, in accordance with certain aspects of the present disclosure. In this case, the falling and rising edges of the clkinm signal occur after the rising and falling edges of the clkinp signal, respectively. However, the rising and falling edges of the clkoutp signal coincide with the falling and rising edges of the clkinm signal, respectively. As a result, the signal clkoutp may not be sensitive to any phase delay between clkinp and clkinm, thus, improving phase error. A similar circuit may be implemented for generating the negative clock signal (clkoutm) of the differential output clock signal.

FIG. 6D is another graph 608 of example clkinp, clkinm, and clkoutp signals of the RSB enhancement circuit 600, in accordance with certain aspects of the present disclosure. In this case, the falling edge of the clkinm signal occurs before the rising edge of the clkinp signal and the rising edge of the clkinm signal occurs after the falling edge of the clkinp signal. As illustrated, the rising edge of the clkoutp signal coincides with the rising edge of the clkinp signal, and the falling edge of the clkoutp signal coincides with the rising edge of the clkinm signal. Thus, the RSB enhancer circuit 600 may also correct for systematic duty cycle distortions that may be present in the clkinp and clkinm signals.

Figure 7:
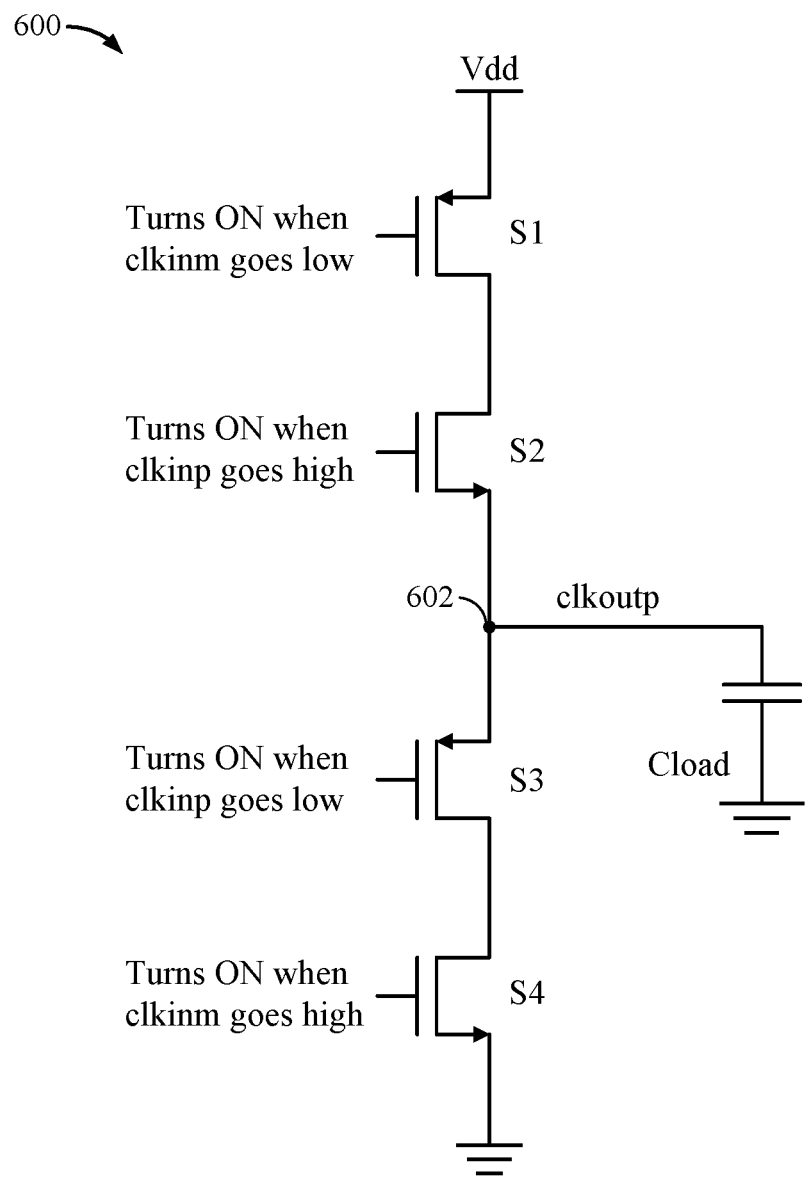
FIG. 7 illustrates the example RSB enhancement circuit of FIG. 6A implemented with transistors, in accordance with certain aspects of the present disclosure.

FIG. 7 illustrates the example RSB enhancement circuit 600 implemented with transistors, in accordance with certain aspects of the present disclosure. For example, switches S1 and S3 may be implemented using PMOS transistors, and switches S2 and S4 may be implemented using NMOS transistors. In this case, the output node 602 may only charge to Vdd-Vth because switch S2 is implemented with an NMOS transistor, where Vth is the threshold of this NMOS transistor (S2). In addition, the output node 602 may only discharge to Vth (e.g., of the PMOS transistor (S3)) because switch S3 is implemented using a PMOS transistor. Thus, aspects of the present disclosure provide assisting transistors that allow a full voltage swing at the output node. For example, the transistors S2 and S3 may be assisted such that the output node 602 can be fully discharged to the reference potential and fully charged to Vdd.

Figure 8:
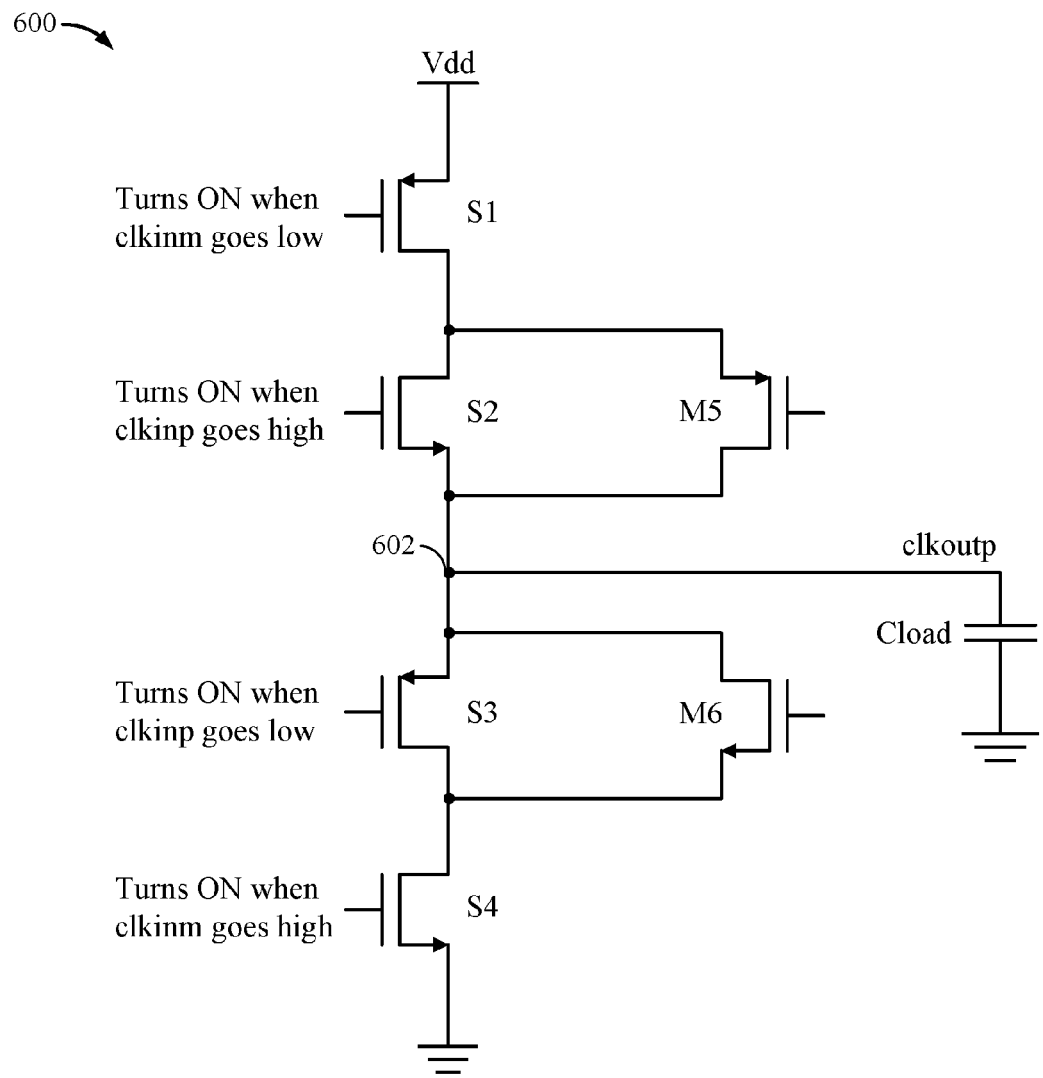
FIG. 8 illustrates the example RSB enhancement circuit of FIG. 6A with two assisting transistors, in accordance with certain aspects of the present disclosure.

FIG. 8 illustrates the example RSB enhancement circuit 600 with assisting transistors, in accordance with certain aspects of the present disclosure. As illustrated, the NMOS transistor S2 can be coupled in parallel with a PMOS transistor M5, and transistor M5 may be biased such that the transistor M5 turns on with NMOS transistor S2. That is, transistor M5 may be biased (e.g., via an inverter) using an inverse of a biasing voltage used to bias the transistor S2. Thus, transistor M5 assists transistor S2 in charging the output node 602 such that the signal clkoutp can reach (or at least get closer to) Vdd. In addition, an NMOS transistor M6 may be coupled in parallel with the PMOS transistor S3 and biased (e.g., via an inverter) using a biasing voltage that is an inverse of a biasing voltage used to bias transistor S3. Transistor M6 can assist transistor S3 in discharging the output node 602 such that the signal clkoutp discharges down to (or at least closer to) the reference potential.

In an example differential implementation, the transition of the clkoutp signal from logic low to logic high begins with transistors S1 and S2 turning on, and transistor M5 assists to pull the clkoutp signal high. Therefore, some delay in biasing transistor M5 to turn on may be acceptable since the transition of the clkoutp signal from logic low to logic high starts with the biasing of transistors S1 and S2, which may be synchronized with the clkinp and clkinm signals. Moreover, the transition of the clkoutp signal from logic high to logic low begins with the transistors S3 and S4 turning on, and thus, even if the transistor M6 is biased with some delay, the transition of the clkoutp signal may remain synchronized with clkinm and clkinp.

Figure 9:
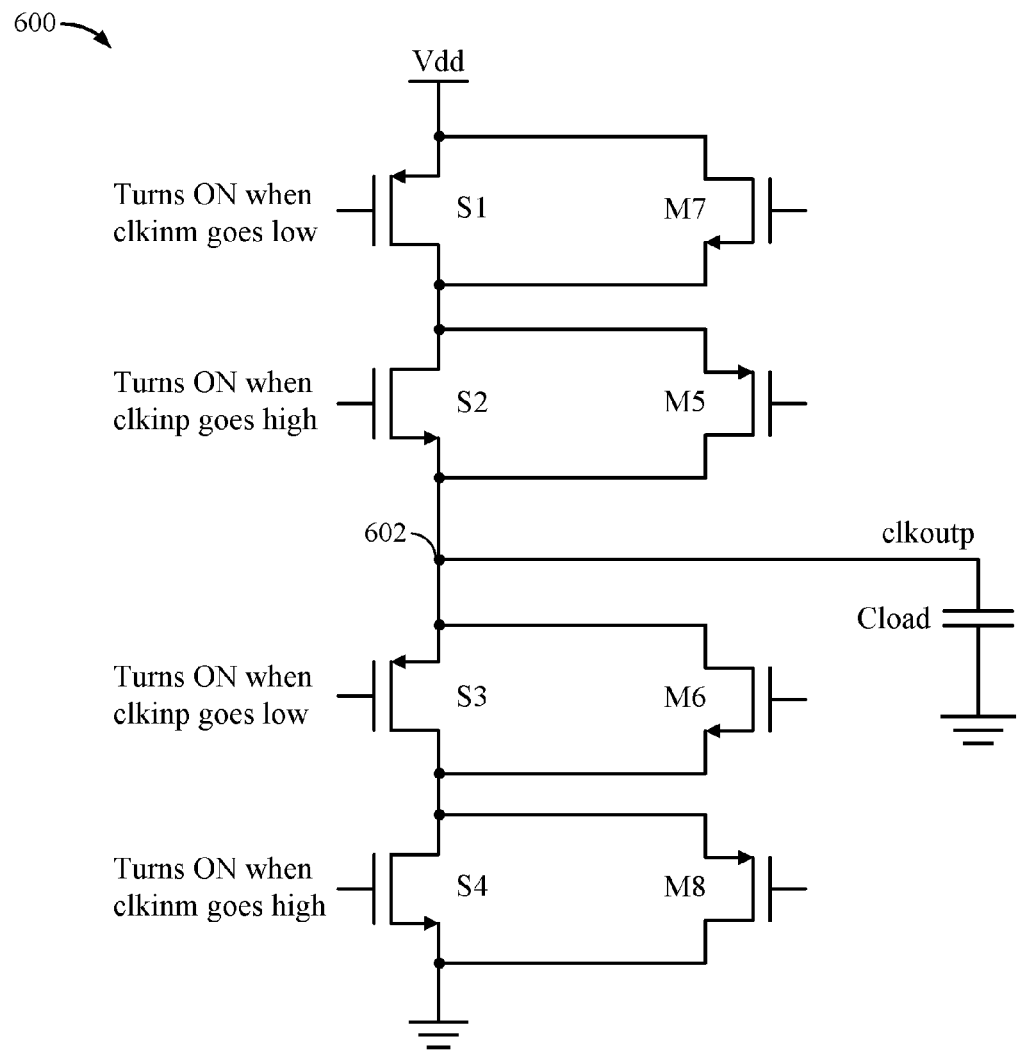
FIG. 9 illustrates the example RSB enhancement circuit of FIG. 6A with four assisting transistors, in accordance with certain aspects of the present disclosure.

FIG. 9 illustrates the example RSB enhancement circuit 600 with four assisting transistors, in accordance with certain aspects of the present disclosure. To make the RSB enhancement circuit 600 symmetrical, assisting transistors may also be coupled in parallel with transistors S1 and S4. For example, an NMOS transistor M7 may be coupled in parallel with PMOS transistor S1, and a PMOS transistor M8 may be coupled in parallel with NMOS transistor S4. By adding assisting transistors M7 and M8, the input load capacitance may be the same (or close to the same) for clkinm and clkinp.

Adding transistors M7 and M8 may make the clkoutp transitions almost equal when the clkinp edge is later than the clkinm edge and when the clkinm edge is later than the clkinp edge. This may be especially beneficial when the RSB enhancement circuit 600 corrects for duty cycle distortion.

Figure 10:
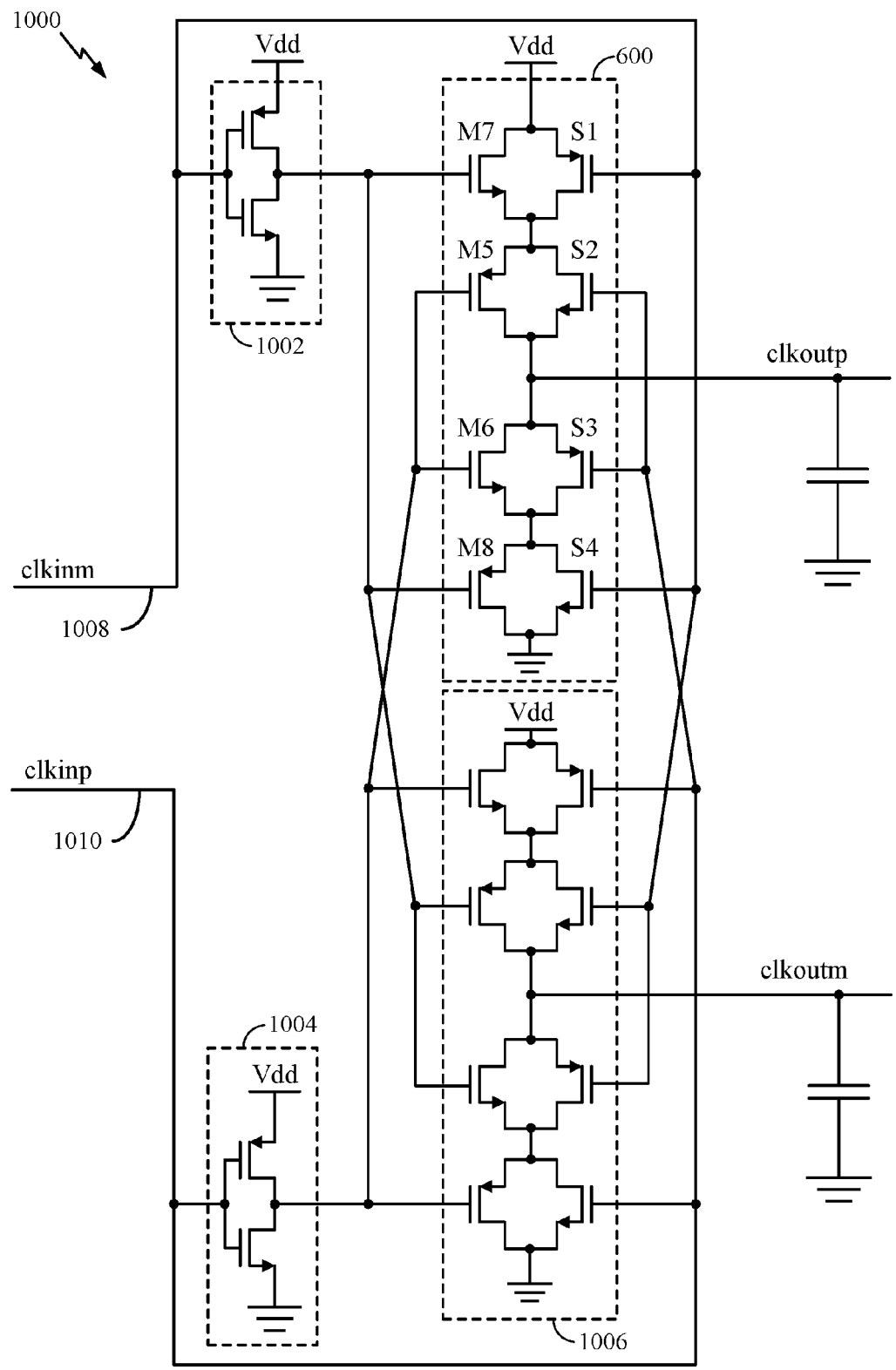
FIG. 10 illustrates an example RSB enhancement circuit for generating a differential clock signal, in accordance with certain aspects of the present disclosure.

FIG. 10 illustrates an example differential RSB enhancement circuit 1000 for generating a differential output clock signal, in accordance with certain aspects of the present disclosure. As illustrated, the example RSB enhancement circuit 600 is implemented for generating the clkoutp and clkoutm signals from differential input clock signals clkinp and clkinm. The differential input signals clkinp and clkinm are provided at input clock nodes 1008 and 1010, respectively. The RSB enhancement circuit 1000 also includes inverters 1002 and 1004 for generating the biasing voltages for the assisting transistors M5-M8. An example RSB enhancement circuit 1006 that may be similar to the RSB enhancement circuit 600 is implemented for generating the clkoutm signal, as illustrated.

Figure 11A:
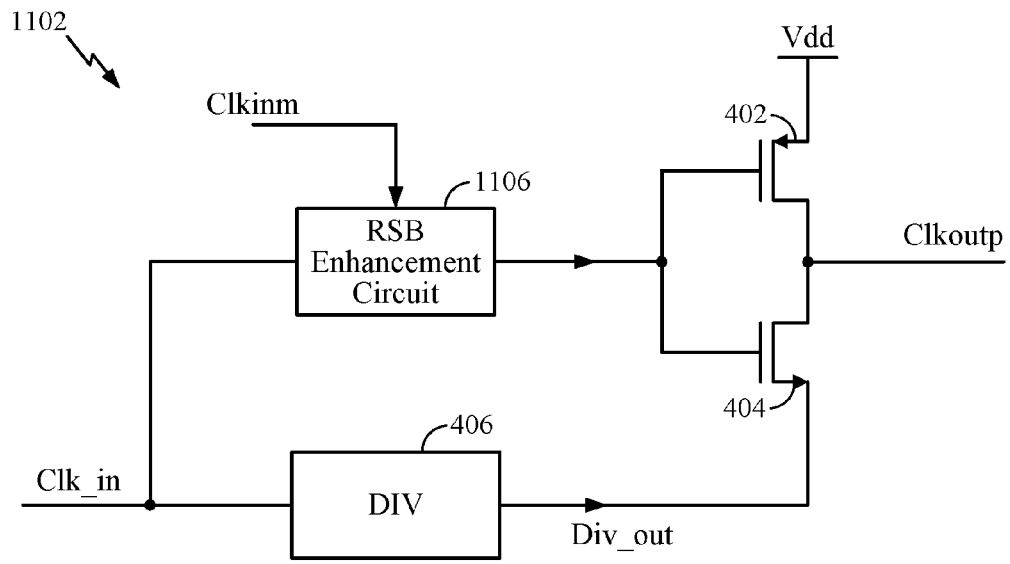
FIGS. 11A and 11B illustrate example clock generation circuits implemented using RSB enhancement circuits, in accordance with certain aspects of the present disclosure.
Figure 11B:
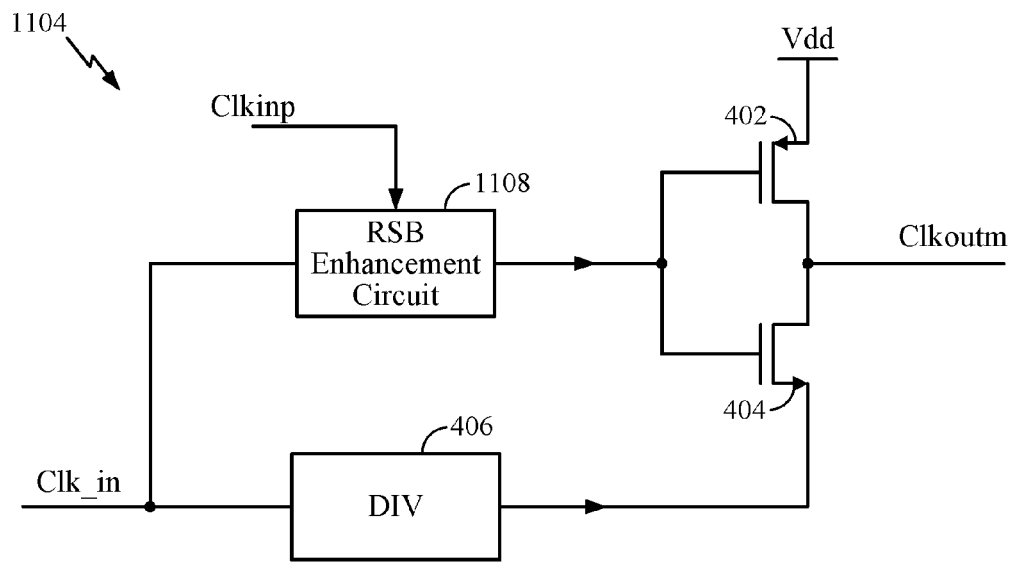

FIGS. 11A and 11B illustrate example clock generation circuits 1102 and 1104 implemented using RSB enhancement circuits 1106 and 1108, respectively, in accordance with certain aspects of the present disclosure. The clock generation circuits 1102 and 1104 correspond to the clock generation circuit 400, but with the gates of the transistors 402 and 404 driven by respective RSB enhancement circuits 1106 and 1108. The RSB enhancement circuits 1106 and 1108 may be implemented using the example RSB enhancement circuits described with respect to FIGS. 6-10.

The clock generation circuit 1102 may be configured to generate the clkoutp signal from the clkinp signal. In this case, the RSB enhancement circuit 1106 may correspond to the RSB enhancement circuit 600 driven by inverters 1002 and 1004. The clock generation circuit 1104 may be configured to generate the clkoutm signal based on the clkinm signal. In this case, the RSB enhancement circuit 1108 may correspond to the RSB enhancement circuit 1006 driven by inverters 1002 and 1004.

Figure 12:
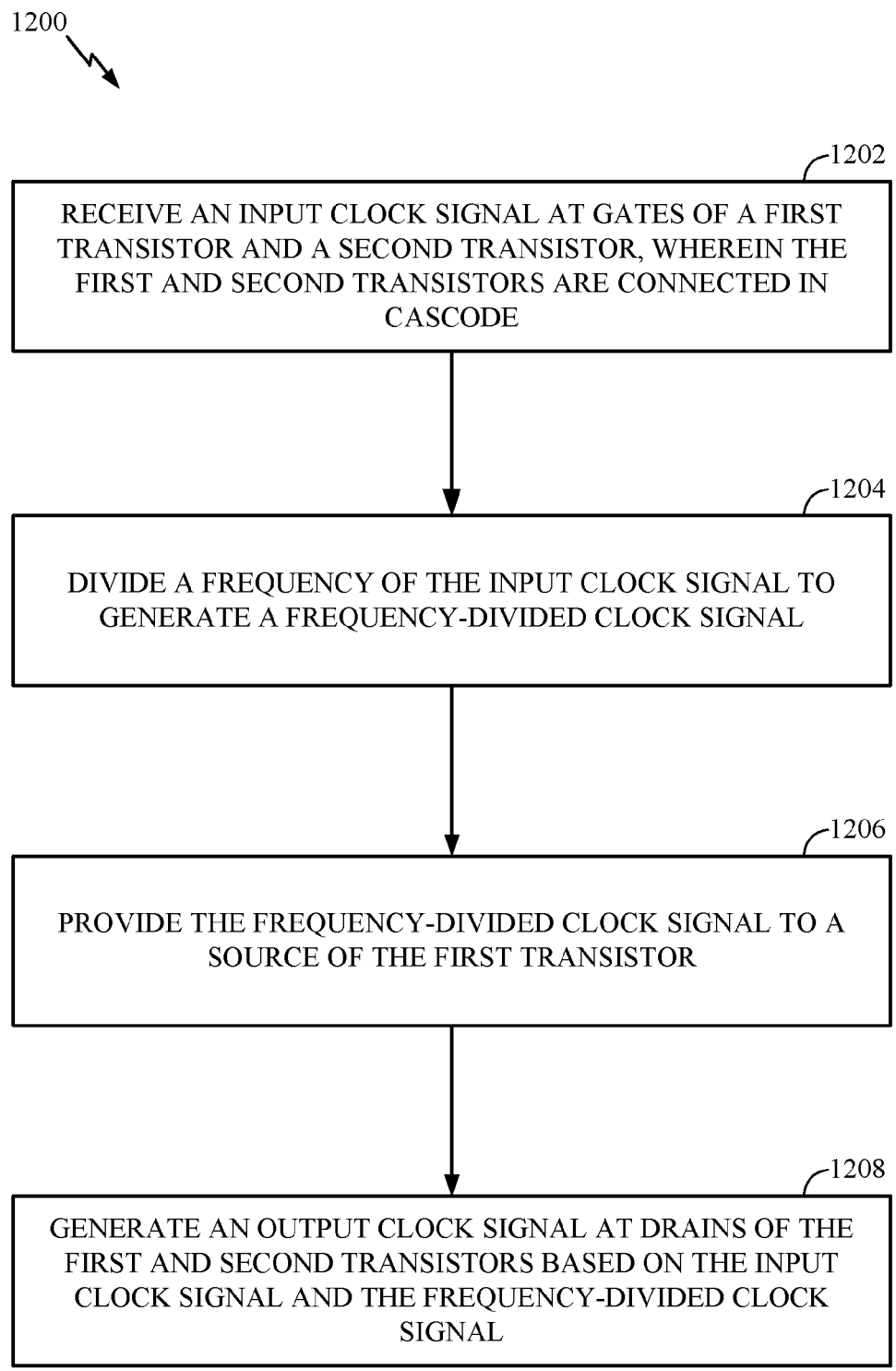
FIG. 12 illustrates example operations for generating an output clock signal, in accordance with certain aspects of the present disclosure.

FIG. 12 is a flow diagram of example operations 1200 for generating an output clock signal, in accordance with certain aspects of the present disclosure. The operations 1200 may be performed by a circuit, such as the circuits of FIGS. 4 and 6-11.

The operations 1200 may begin, at block 1202, by receiving an input clock signal at gates of a first transistor (e.g., transistor 402) and a second transistor (e.g., transistor 404, wherein the first and second transistors are connected in cascode). At block 1204, the circuit may divide (e.g., via frequency divider 406) a frequency of the input clock signal to generate a frequency-divided clock signal, and at 1206, provide the frequency-divided clock signal to a source of the first transistor. At 1208, the circuit may generate the output clock signal (e.g., Clk_out of FIG. 4) at drains of the first and second transistors based on the input clock signal and the frequency-divided clock signal.

In certain aspects, a frequency of the frequency-divided clock signal is half the frequency of the input clock signal. In certain aspects, the output clock signal has a twenty-five percent duty cycle. In some cases, the output clock signal has a different duty cycle than the input clock signal.

In certain aspects, the operations 1200 may further include enhancing a residual sideband of the input clock signal, wherein the receiving comprises receiving the input clock signal with the enhanced residual sideband at the gates of the first transistor and the second transistor. In certain aspects, enhancing the residual sideband of the input clock signal comprises receiving the input clock signal of a differential input clock signal at a gate of a first p-channel metal-oxide semiconductor (PMOS) transistor (e.g., transistor S1 of FIG. 7) connected in cascode with a first n-channel metal-oxide semiconductor (NMOS) transistor (e.g., transistors S2 of FIG. 7) and a gate of a second NMOS transistor (e.g., transistor S4 of FIG. 7) connected in cascode with a second PMOS transistor (e.g., transistor S3 of FIG. 7). In certain aspects, the operations 1200 also include receiving another input clock signal of the differential input clock signal at a gate of the first NMOS transistor and a gate of the second PMOS transistor, and generating the input clock signal with the enhanced residual sideband at sources of the first NMOS transistor and the second PMOS transistor.

In certain aspects, the operations 1200 also include inverting the input clock signal and providing the inverted input clock signal to a gate of a third NMOS transistor coupled in parallel with the first PMOS transistor and a gate of a third PMOS transistor coupled in parallel with the second NMOS transistor. In certain aspects, the second input clock signal may be inverted the inverted second input clock signal may be provided to a gate of a fourth PMOS transistor coupled in parallel with the first NMOS transistor and a gate of a fourth NMOS transistor coupled in parallel with the second PMOS transistor.

Figure 13:
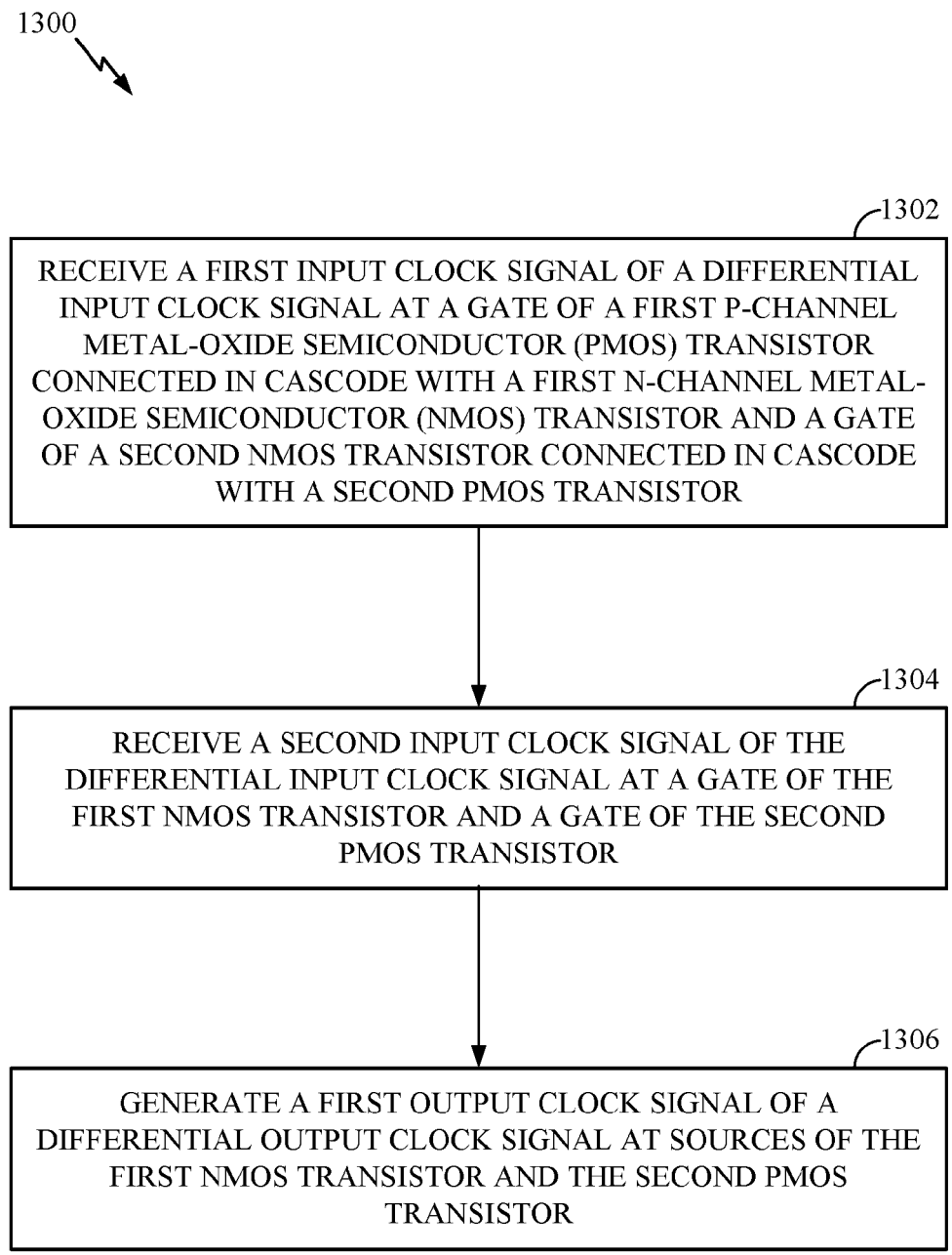
FIG. 13 illustrates example operations for generating a differential clock signal, in accordance with certain aspects of the present disclosure.

FIG. 13 is a flow diagram of example operations 1300 for generating a differential output clock signal with reduced phase delay compared to a differential input clock signal, in accordance with certain aspects of the present disclosure. The operations 1300 may be performed by a circuit, such as the circuits of FIGS. 6-10.

The operations 1300 may begin, at block 1302, by receiving a first input clock signal (e.g., clkinm) of the differential input clock signal at a gate of a first p-channel metal-oxide semiconductor (PMOS) transistor connected in cascode with a first n-channel metal-oxide semiconductor (NMOS) transistor and a gate of a second NMOS transistor connected in cascode with a second PMOS transistor, and at 1304, receiving a second input clock signal (e.g., clkinp) of the differential input clock signal at a gate of the first NMOS transistor and a gate of the second PMOS transistor. At 1306, a first output clock signal (e.g., clkoutp) of the differential output clock signal may be generated at sources of the first NMOS transistor and the second PMOS transistor. In certain aspects, the operations 1300 may also include receiving a supply voltage at a source of the first PMOS transistor and receiving a reference potential at a source of the second NMOS transistor.

In certain aspects, the operations 1300 also include inverting the first input clock signal, providing the inverted first input clock signal to a gate of a third NMOS transistor (e.g., transistor M7) coupled in parallel with the first PMOS transistor and a gate of a third PMOS transistor (e.g., transistor M8) coupled in parallel with the second NMOS transistor. In some cases, the second input clock signal may be inverted and the inverted second input clock signal may be provided to a gate of a fourth PMOS transistor coupled in parallel with the first NMOS transistor and a gate of a fourth NMOS transistor coupled in parallel with the second PMOS transistor.

In certain aspects, the operations 1300 also include receiving the second input clock signal of the differential input clock signal at a gate of the third PMOS transistor and a gate of the fourth NMOS transistor, and receiving the first input clock signal of the differential input clock signal at a gate of the third NMOS transistor and a gate of the fourth PMOS transistor. In this case, a second output clock signal of the differential output signal may be generated at sources of the third NMOS transistor and the fourth PMOS transistor. In certain aspects, a supply voltage may be received at a source of the third PMOS transistor, and a reference potential may be received at a source of the fourth NMOS transistor.

In certain aspects, the operations 1300 also include inverting the first input clock signal, providing the inverted input clock signal to a gate of a fifth NMOS transistor coupled in parallel with the first PMOS transistor and a gate of a fifth PMOS transistor coupled in parallel with the second NMOS transistor. In some cases, the second input clock signal may be inverted, and the inverted second input clock signal may be provided to a gate of a sixth PMOS transistor coupled in parallel with the first NMOS transistor and a gate of a sixth NMOS transistor coupled in parallel with the second PMOS transistor. In some cases, the operations 1300 also include providing the inverted second input clock signal to a gate of a seventh NMOS transistor coupled in parallel with the third PMOS transistor and a gate of a seventh PMOS transistor coupled in parallel with the fourth NMOS transistor. In this case, the inverted first input clock signal may be provided to a gate of an eighth PMOS transistor coupled in parallel with the third NMOS transistor and a gate of an eighth NMOS transistor coupled in parallel with the fourth PMOS transistor.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252*ma* through 252*mu* of the user terminal 120*m* portrayed in FIG. 2, the antennas 224*a* through 224*ap* of the access point 110 illustrated in FIG. 2, or the antenna 303 of the transceiver front end 300 depicted in FIG. 3). Means for receiving may comprise a receiver (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252*ma* through 252*mu* of the user terminal 120*m* portrayed in FIG. 2, the antennas 224*a* through 224*ap* of the access point 110 illustrated in FIG. 2, or the antenna 303 of the transceiver front end 300 depicted in FIG. 3). Means for processing, means for determining, and means for operating may comprise a processing system, which may include one or more processors (e.g., the TX data processor 210, the RX data processor 242, and/or the controller 230 of the access point 110 shown in FIG. 2, or the RX data processor 270, the TX data processor 288, and/or the controller 280 of the user terminal 120 illustrated in FIG. 2). Means for receiving, means for providing, and/or means for generating may include a transistor (e.g., transistors 402 and 404 of FIG. 4) or a power supply (e.g., a power supply to generate voltage rail Vdd). Means for dividing may include a divider (e.g., frequency divider 406). Means for inverting may include an inverter (e.g., inverter 1002 or inverter 1004).

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A clock generation circuit, comprising:
a first transistor coupled to a second transistor, wherein an input clock node of the circuit is coupled to gates of the first and second transistors; and
a frequency divider circuit having an input coupled to the input clock node, wherein an output of the frequency divider circuit is coupled to a source of the second transistor, and wherein an output node of the clock generation circuit is coupled to drains of the first and second transistors.

2. The clock generation circuit of claim 1, wherein the frequency divider circuit is configured to:
generate a divided clock signal based on a signal at the input clock node; and
provide the divided clock signal to the source of the second transistor, wherein a frequency of the divided clock signal is lower than a frequency of the signal at the input clock node.

3. The clock generation circuit of claim 1, wherein the frequency divider circuit comprises a divide-by-two (DIV2) frequency divider circuit.

4. The clock generation circuit of claim 1, further comprising a residual sideband (RSB) enhancement circuit having an input coupled to the input clock node, wherein an output of the RSB enhancement circuit is coupled to the gates of the first and second transistors.

5. The clock generation circuit of claim 4, wherein the RSB enhancement circuit comprises:
a first p-channel metal-oxide semiconductor (PMOS) transistor coupled to a first n-channel metal-oxide semiconductor (NMOS) transistor, wherein a source of the first PMOS transistor is coupled to a voltage rail; and
a second PMOS transistor coupled to a second NMOS transistor, wherein:
a source of the second NMOS transistor is coupled to a reference potential;
sources of the first NMOS transistor and the second PMOS transistor are coupled to the output of the RSB enhancement circuit;
a gate of the first PMOS transistor and a gate of the second NMOS transistor are coupled to the input clock node of a differential clock input; and
a gate of the first NMOS transistor and a gate of the second PMOS transistor are coupled to another input clock node of the differential clock input.

6. The clock generation circuit of claim 5, further comprising:
a third NMOS transistor coupled in parallel with the first PMOS transistor;
a third PMOS transistor coupled in parallel with the first NMOS transistor;
a fourth NMOS transistor coupled in parallel with the second PMOS transistor;
a fourth PMOS transistor coupled in parallel with the second NMOS transistor;
a first inverter having an input coupled to the input clock node, wherein gates of the third NMOS transistor and the fourth PMOS transistor are driven by an output signal of the first inverter; and
a second inverter having an input coupled to the other input clock node, wherein gates of the third PMOS transistor and the fourth NMOS transistor are driven by an output signal of the second inverter.

7. A circuit for generating a differential clock signal, comprising:
a first p-channel metal-oxide semiconductor (PMOS) transistor coupled to a first n-channel metal-oxide semiconductor (NMOS) transistor, wherein a source of the first PMOS transistor is coupled to a voltage rail; and
a second PMOS transistor coupled to a second NMOS transistor, wherein:
a source of the second NMOS transistor is coupled to a reference potential;
sources of the first NMOS transistor and the second PMOS transistor are coupled to a first output of a differential output node of the circuit;
a gate of the first PMOS transistor and a gate of the second NMOS transistor are coupled to a first input clock node of a differential input of the circuit; and
a gate of the first NMOS transistor and a gate of the second PMOS transistor are coupled to a second input clock node of the differential input.

8. The circuit of claim 7, further comprising:
a third NMOS transistor coupled in parallel with the first PMOS transistor;
a third PMOS transistor coupled in parallel with the first NMOS transistor;
a fourth NMOS transistor coupled in parallel with the second PMOS transistor;
a fourth PMOS transistor coupled in parallel with the second NMOS transistor;
a first inverter having an input coupled to the first input clock node, wherein gates of the third NMOS transistor and the fourth PMOS transistor are coupled to an output of the first inverter; and
a second inverter having an input coupled to the second input clock node, wherein gates of the third PMOS transistor and the fourth NMOS transistor are coupled to an output of the second inverter.

9. The circuit of claim 7, further comprising:
a third PMOS transistor coupled to a third NMOS transistor, wherein a source of the third PMOS transistor is coupled to the voltage rail; and
a fourth PMOS transistor coupled to a fourth NMOS transistor, wherein:
a source of the fourth NMOS transistor is coupled to the reference potential;
sources of the third NMOS transistor and the fourth PMOS transistor are coupled to a second output of the differential output node;
a gate of the third PMOS transistor and a gate of the fourth NMOS transistor are coupled to the second input clock node of the differential input; and
a gate of the third NMOS transistor and a gate of the fourth PMOS transistor are coupled to the first input clock node of the differential input.

10. The circuit of claim 9, further comprising:
a fifth NMOS transistor coupled in parallel with the first PMOS transistor;
a fifth PMOS transistor coupled in parallel with the first NMOS transistor;
a sixth NMOS transistor coupled in parallel with the second PMOS transistor;

a sixth PMOS transistor coupled in parallel with the second NMOS transistor;
a first inverter having an input coupled to the first input clock node, wherein gates of the fifth NMOS transistor and the sixth PMOS transistor are coupled to an output of the first inverter; and
a second inverter having an input coupled to the second input clock node, wherein gates of the fifth PMOS transistor and the sixth NMOS transistor are coupled to an output of the second inverter.

11. The circuit of claim 10, further comprising:
a seventh NMOS transistor coupled in parallel with the third PMOS transistor;
a seventh PMOS transistor coupled in parallel with the third NMOS transistor;
an eighth NMOS transistor coupled in parallel with the fourth PMOS transistor; and
an eighth PMOS transistor coupled in parallel with the fourth NMOS transistor, wherein gates of the seventh NMOS transistor and the eighth PMOS transistor are coupled to the output of the second inverter, and wherein gates of the seventh PMOS transistor and the eighth NMOS transistor are coupled to the output of the first inverter.

12. A method for generating an output clock signal, comprising:
receiving an input clock signal at gates of a first transistor and a second transistor, wherein the first transistor is coupled to the second transistor;
dividing a frequency of the input clock signal to generate a frequency-divided clock signal;
providing the frequency-divided clock signal to a source of the first transistor; and
generating the output clock signal at drains of the first and second transistors based on the input clock signal and the frequency-divided clock signal.

13. The method of claim 12, wherein a frequency of the frequency-divided clock signal is half the frequency of the input clock signal.

14. The method of claim 12, wherein the output clock signal has a twenty-five percent duty cycle.

15. The method of claim 12, wherein the output clock signal has a different duty cycle than the input clock signal.

16. The method of claim 12, further comprising enhancing a residual sideband of the input clock signal, wherein the receiving comprises receiving the input clock signal with the enhanced residual sideband at the gates of the first transistor and the second transistor.

17. The method of claim 16, wherein enhancing the residual sideband of the input clock signal comprises:
receiving the input clock signal of a differential input clock signal at a gate of a first p-channel metal-oxide semiconductor (PMOS) transistor coupled to a first n-channel metal-oxide semiconductor (NMOS) transistor and at a gate of a second NMOS transistor coupled to a second PMOS transistor;
receiving another input clock signal of the differential input clock signal at a gate of the first NMOS transistor and a gate of the second PMOS transistor; and
generating the input clock signal with the enhanced residual sideband at sources of the first NMOS transistor and the second PMOS transistor.

18. The method of claim 17, further comprising:
inverting the input clock signal;
providing the inverted input clock signal to a gate of a third NMOS transistor coupled in parallel with the first PMOS transistor and a gate of a third PMOS transistor coupled in parallel with the second NMOS transistor;
inverting the second input clock signal; and
providing the inverted second input clock signal to a gate of a fourth PMOS transistor coupled in parallel with the first NMOS transistor and a gate of a fourth NMOS transistor coupled in parallel with the second PMOS transistor.

19. A method for generating a differential output clock signal with reduced phase delay compared to a differential input clock signal, comprising:
receiving a first input clock signal of the differential input clock signal at a gate of a first p-channel metal-oxide semiconductor (PMOS) transistor coupled to a first n-channel metal-oxide semiconductor (NMOS) transistor and at a gate of a second NMOS transistor coupled to a second PMOS transistor;
receiving a second input clock signal of the differential input clock signal at a gate of the first NMOS transistor and a gate of the second PMOS transistor; and
generating a first output clock signal of the differential output clock signal at sources of the first NMOS transistor and the second PMOS transistor.

20. The method of claim 19, further comprising:
receiving a supply voltage at a source of the first PMOS transistor; and
receiving a reference potential at a source of the second NMOS transistor.

21. The method of claim 19, further comprising:
inverting the first input clock signal;
providing the inverted first input clock signal to a gate of a third NMOS transistor coupled in parallel with the first PMOS transistor and a gate of a third PMOS transistor coupled in parallel with the second NMOS transistor;
inverting the second input clock signal; and
providing the inverted second input clock signal to a gate of a fourth PMOS transistor coupled in parallel with the first NMOS transistor and a gate of a fourth NMOS transistor coupled in parallel with the second PMOS transistor.

22. The method of claim 19, further comprising:
receiving the second input clock signal of the differential input clock signal at a gate of a third PMOS transistor coupled to a third NMOS transistor and at a gate of a fourth NMOS transistor coupled to a fourth PMOS transistor;
receiving the first input clock signal of the differential input clock signal at a gate of the third NMOS transistor and a gate of the fourth PMOS transistor; and
generating a second output clock signal of the differential output clock signal at sources of the third NMOS transistor and the fourth PMOS transistor.

23. The method of claim 22, further comprising:
receiving a supply voltage at a source of the third PMOS transistor; and
receiving a reference potential at a source of the fourth NMOS transistor.

24. The method of claim 22, further comprising:
inverting the first input clock signal;
providing the inverted input clock signal to a gate of a fifth NMOS transistor coupled in parallel with the first PMOS transistor and a gate of a fifth PMOS transistor coupled in parallel with the second NMOS transistor;
inverting the second input clock signal; and
providing the inverted second input clock signal to a gate of a sixth PMOS transistor coupled in parallel with the first NMOS transistor and a gate of a sixth NMOS transistor coupled in parallel with the second PMOS transistor.

25. The method of claim 24, further comprising:

providing the inverted second input clock signal to a gate of a seventh NMOS transistor coupled in parallel with the third PMOS transistor and a gate of a seventh PMOS transistor coupled in parallel with the fourth NMOS transistor; and providing the inverted first input clock signal to a gate of an eighth PMOS transistor coupled in parallel with the third NMOS transistor and a gate of an eighth NMOS transistor coupled in parallel with the fourth PMOS transistor.

* * * * *